United States Patent
Yoshioka et al.

(10) Patent No.: US 9,293,242 B2
(45) Date of Patent: Mar. 22, 2016

(54) SHUNT RESISTOR DEVICE

(75) Inventors: Tadahiko Yoshioka, Ina (JP); Koichi Hirasawa, Ina (JP); Yoshinori Aruga, Ina (JP)

(73) Assignee: KOA CORPORATION, Ina-shi (JP)

(*) Notice: Subject to any disclaimer, the term of this patent is extended or adjusted under 35 U.S.C. 154(b) by 112 days.

(21) Appl. No.: 14/129,409

(22) PCT Filed: Jul. 20, 2012

(86) PCT No.: PCT/JP2012/068466
§ 371 (c)(1),
(2), (4) Date: Dec. 26, 2013

(87) PCT Pub. No.: WO2013/015219
PCT Pub. Date: Jan. 31, 2013

(65) Prior Publication Data
US 2014/0125429 A1 May 8, 2014

(30) Foreign Application Priority Data

Jul. 22, 2011 (JP) ................. 2011-160687

(51) Int. Cl.
*G01R 19/00* (2006.01)
*H01C 1/14* (2006.01)
*G01R 1/20* (2006.01)

(52) U.S. Cl.
CPC ........... *H01C 1/14* (2013.01); *G01R 1/203* (2013.01); *G01R 19/0084* (2013.01)

(58) Field of Classification Search
CPC .......... H01C 1/14; H01C 1/148; H01C 17/00; H01C 17/28; G01R 15/14; G01R 15/19; G01R 19/00; G01R 19/02; G01R 19/0092; G01R 1/20
USPC .......... 324/76.11; 338/49, 322–332; 438/527–576, 620.04
See application file for complete search history.

(56) References Cited

U.S. PATENT DOCUMENTS

| 2,120,056 | A | * | 6/1938 | McCabe | 338/20 |
| 4,720,697 | A | * | 1/1988 | Bizzarri | 338/329 |
| 6,798,189 | B2 | * | 9/2004 | Hirasawa | G01R 1/203 324/126 |
| 2007/0177318 | A1 | * | 8/2007 | Oman et al. | 361/58 |
| 2012/0229247 | A1 | * | 9/2012 | Yoshioka | 338/49 |

FOREIGN PATENT DOCUMENTS

| JP | 2002-372551 A | 12/2002 |
| JP | 2003-121481 A | 4/2003 |
| WO | 2011/068205 A1 | 6/2011 |

OTHER PUBLICATIONS

International Search Report for PCT/JP2012/068466, Mailing Date of Aug. 14, 2012.

* cited by examiner

*Primary Examiner* — Jeff Natalini
*Assistant Examiner* — Steven Yeninas
(74) *Attorney, Agent, or Firm* — Westerman, Hattori, Daniels & Adrian, LLP

(57) ABSTRACT

Provided is a voltage detection circuit, which can remove influence of error voltage caused by tiny amount of self-inductance existing in a shunt resistor, though in the resistor for large current usage, which is impossible to surface-mount on a voltage detection circuit board. The shunt resistor device comprises: a resistance body (11); a pair of main electrode (12) for flowing current to be monitored through the resistance body; a pair of detection terminal (13a) for detecting voltage caused in the resistance body; and a pair of wiring (23) each electrically connected to the detection terminal. And, a pair of voltage detection wiring consisting of the detection terminal (13a) and the wiring (23) is brought closer, at prescribed location, than distance between each of connection position of the pair of the detection terminal (13a) on the main electrode (12). A low-pass filter having resistance value (r) and capacitance (C) is provided at next stage after the pair of the wiring, and said low-pass filter having a relationship Le/R=C·r, when Le (=L−M) is the effective inductance, and R is the resistance value of the resistance body.

6 Claims, 8 Drawing Sheets

11 : Resistance body    12 : Main electrode    13a : Detection terminal
23 : Wiring    23a : Pararell wires or twisted wires
A : Connection portion where detection terminal is connected to main electrode
B : Predetermined distance, that is, Distance between detection terminals (almost same with distance between connection portions)
C : Distance between wirings 11 : Resistance body     12 : Main electrode     13a : Detection terminal 23 : Wiring     23a : Pararell wires or twisted wires A : Connection portion where detection terminal is connected to main electrode B : Predetermined distance, that is, Distance between detection terminals (almost same with distance between connection portions)

C : Distance between wirings

Voltage between A'B' = R·I + (L−M)·dI/dt
= R·I + Le·dI/dt

Assuming $Zin >> |R + j\omega Le|$ $Vout \cong I \times (R + j\omega Le) \times \dfrac{1/(j\omega C)}{r + 1/(j\omega C)} = I \times R \times \dfrac{1 + j\omega Le/R}{1 + j\omega C \times r}$ When $Le/R = C \times r$ Then $Vout = I \times R$

SHUNT RESISTOR DEVICE

TECHNICAL FIELD

The invention relates to a voltage detection device of a shunt resistor, especially relating to a structure of voltage detection device, which takes out a voltage formed at both ends of resistance body by the current to be monitored flowing through the resistance body.

BACKGROUND ART

The shunt resistor is used, for example, for monitoring battery current of electrical charge and discharge, and for controlling battery current of electrical charge and discharge etc. The shunt resistor is inserted in the route of the current to be monitored, the voltage caused at both ends of the shunt resistor by the current is detected, and the current is detected from already-known resistance value. A structure of voltage detection circuit, which takes out voltage caused at both ends of the resistor, has been proposed in laid-open Japanese patent publication 2003-121481.

In the patent publication, a wiring structure has been described so that error voltage caused by tiny self-inductance of current detection resistor of surface-mount type can be prevented from influencing the detection voltage of the resistor by cancelling the error voltage. The error voltage caused by self-inductance existing in the resistor is cancelled by voltage basing on mutual-inductance formed at voltage detection wiring, which is disposed close to along central axis of the surface mount-type resistor (refer to FIG. 3 and [0016]-[0021]).

However, since shunt resistor for high current usage is generally large in size, and thus it is difficult to surface-mount on voltage detection circuit board etc. Therefore, there are cases where application of above-mentioned wiring structure might be difficult.

SUMMARY OF INVENTION

Technical Problem

The invention has been made basing on above-mentioned circumstances. Therefore object of the invention is to provide a voltage detection circuit, which can remove influence of error voltage caused by tiny amount of self-inductance existing in the resistor.

Solution to Problem

The shunt resistor device of the invention comprises a resistance body; a pair of main electrodes for flowing current to be monitored through the resistance body; a pair of detection terminals for detecting voltage across the resistance body, each detection terminal connected to one of main electrodes; a pair of wirings each electrically connected to one of detection terminals; and a pair of connection portions on the pair of main electrodes, wherein each of the detection terminals is directed outward from one of the connection portions, while keeping a predetermined distance between the pair of detection terminals to be constant, the wirings are bent at a predetermined location from the pair of main electrodes such that a distance between the wirings is smaller at the predetermined location than the predetermined distance between the pair of detection terminals. Moreover, a low-pass filter consisting of a resistance (r) and a capacitance (C) is coupled with the pair of wirings, and the low-pass filter has the relationship, $$Le/R = C \cdot r$$

assuming an effective inductance (Le) (=a self-inductance (L) of the resistance body – a mutual-inductance (M) of the pair of wirings), and a resistance value (R) of the resistance body.

According to the invention, a magnetic flux Φ formed by a current I flowing through the resistance body pass through the pair of the wirings to cause a mutual-inductance M. Therefore, besides detected voltage basing on the resistance R of the resistance body and the current I that flows through the resistance body, an error voltage basing on the self-inductance L of the resistance body itself and the voltage basing on the mutual-inductance M of the pair of wirings are formed (refer to FIG. 4). And, by coupling with a low-pass filter at a latter part, the error voltage caused by the current I flowing through the self-inductance L of the resistance body is cancelled by the voltage caused by the pair of wirings and the low-pass filter, and the error voltage doesn't appear to the output voltage. As a result, only the voltage of the product of the resistance R of the resistance body and the current I is taken out to the output voltage, and the error voltage has been removed (Refer to FIG. 8).

DESCRIPTION OF EMBODIMENTS

Figure 1:
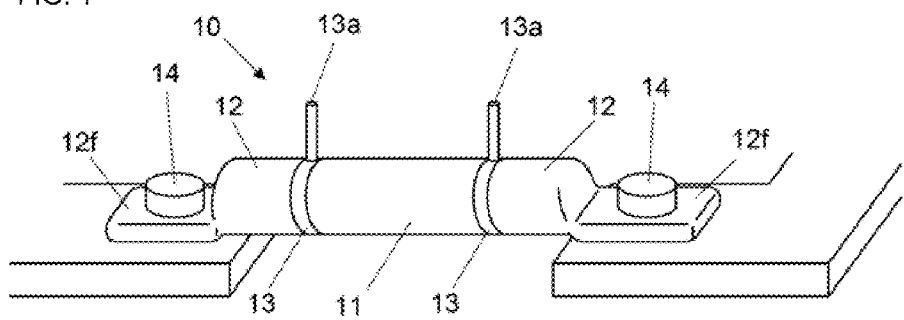
FIG. 1 is a perspective view, which shows an embodiment of the shunt resistor.

Embodiments of the invention will be described below with referring to FIG. 1 through FIG. 16. Like or corresponding parts or elements will be denoted and explained by same reference characters throughout views.

FIG. 1 shows a shunt resistor of an embodiment of the invention. The shunt resistor 10 is provided with a rod-shaped (columnar) resistance body 11 consisting of resistive alloy material such as Manganin etc., a pair of rod-shaped (columnar) main electrode 12,12 consisting of highly conductive metal material such as copper etc., and a pair of detection terminal 13a,13a projected upward near the resistance body 11. The detection terminal 13a is extended from terminal material (voltage detection electrode) 13, which is abutted and fixed to both end faces of the resistance body, so that voltage caused through resistance body 11 is detected. Or, detection terminal 13a is connected on a prescribed connection portion of main electrode 12, and in the example, the terminal 13a is connected on near end face of main electrode 12 of resistance body 11 sides. A connector 21 can be connected with detection terminal 13a, and a pair of wiring 23,23 connecting to a voltage detection circuit is electrically connected to the terminal 13a by the connector 21.

A voltage detection electrode 13 is disposed between resistance body 11 and main electrode 12 for flowing current to be monitored through the resistance body in the resistor 10. And, an end face of plate-shaped voltage detection electrode 13 and an end face of columnar-shaped main electrode 12 are fixed to both end faces of columnar shaped resistance body in length direction so as to oppose each other. Here, resistance body 11 and voltage detection electrode 13, and main electrode 12 and voltage detection electrode 13, are abutted and bonded at their joint faces by welding, pressure bonding, or brazing. Thus, joint faces are electrically stable and mechanically strong. Therefore, at detection terminal 13a, detecting the voltage basing on resistance value and its TCR of resistance body itself becomes possible without influence of resistance component of copper material of the main electrode.

According to the shunt resistor 10, since voltage detection electrode and detection terminal is an integral part, the resistor's assembly process becomes simple. Moreover, difference of fixing position of detection terminal 13a can be controlled, and voltage detection at nearest position to resistance body 11 becomes possible.

Since, voltage detection electrode 13 is a part of main electrode, it never comes off from the joint part, it excels also in durability, and change of resistance with lapse of time becomes small. The electrode and the resistance body are pillar-shaped as a whole, and there is no lapped portion in direction of either thickness or diameter. Also, since the electrode and the resistance body are bonded at their cross-section (end face), and they are bonded at all over the joint face, smooth current pathway and heat radiation route are obtained, and bonding strength is also strong.

The shunt resistor 10 has a structure that flatness parts 12f, 12f are formed at both ends of columnar electrodes 12, 12. The flatness part 12f has opening 14 therein. And, it forms a structure that bus bar connected with battery etc. can be connected and fixed to flatness part 12f by using bolt and nut through opening 14. Opening 14 may be a screw hole, and may fix the bus bar to flatness part 12f by screw stop. Since flatness part 12f is provided, it becomes easy to connect to fix with bus bar or tabular metal terminal fittings.

Figure 2:
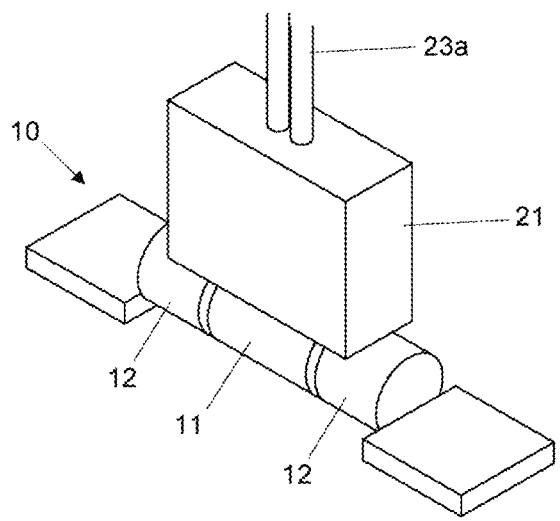
FIG. 2 is a perspective view, which shows a shunt resistor device, where a connector is installed to the shunt resistor.

FIG. 2 shows status that detection terminal 13a of voltage detection electrode 13 is connected to connector 21 of voltage detection circuit. As above-mentioned, the shunt resistor is inserted in the route of current to be monitored, voltage caused at both ends of resistance body 11 by the current is detected by voltage detection circuit, and current is detected basing on already-known resistance value. At input portion of the voltage detection circuit, there is provided with a connector 21, which can connect to detection terminal 13a.

Figure 3A:
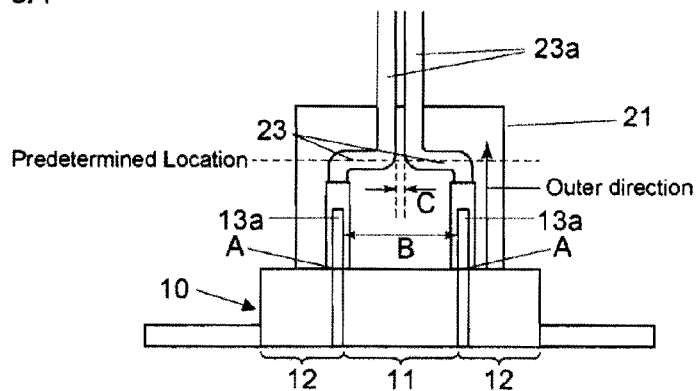
FIG. 3A is a construction view, which see the shunt resistor device of FIG. 2 from the front.

FIG. 3A shows inside of the connector 21. The connector 21 is provided with a pair of wirings 23, which is fitted and electrically connected to detection terminals 13a. A pair of voltage detection wirings, which consists of detection terminal 13a and wiring 23 electrically connected thereto, is pulled out from connection portions on main electrodes 12 to an outer direction while keeping a predetermined distance to be constant, and is brought to be close mutually after then.

That is, ends of the pair of voltage detection wirings are extending upward while keeping the predetermined distance, that is, almost same with the distance between the pair of connection portions (distance along the direction of the central axis of the resistance body 11). And, at a predetermined location away from the resistance body 11, the pair of wirings 23 is brought to be close mutually in almost parallel direction with the axis direction of the resistance body. And, wirings 23 are connected to a voltage detection circuit board (not shown) through parallel wires or twisted wires 23a. Further, the predetermined location in the above-sentence is a position away from the resistance body and/or a position where the pair of voltage detection wirings becomes close. The pair of voltage detection wirings consisting of detection terminal 13a and wiring 23 is brought to be close by bending wirings 23. The predetermined location where voltage detection wirings is brought to be close is formed in the connector 21. As to parallel wires or twisted wires 23a, it is preferable that the pair of wires 23a is adjacent and not affected by outer magnetic fluxes or electrical fields.

Figure 3B:
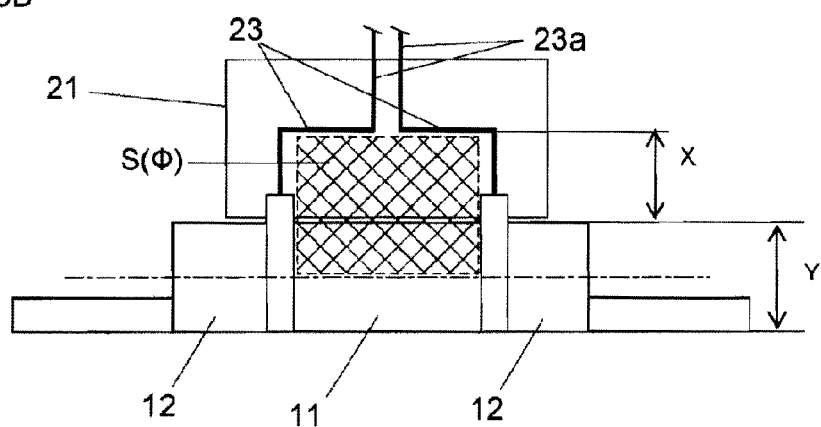
FIG. 3B is a construction view, which see the shunt resistor device of FIG. 2 from the front.

FIG. 3B is a concept view of status that connector 21 and shunt resistor 10 are connected. As shown in the Figure, magnetic flux φ formed by current I flowing through resistance body 11 pass through surface S formed by a pair of voltage detection wiring and central axis of resistance body 11, (where magnetic flux φ causes self inductance L at inside of resistance body 11 and magnetic flux φ causes mutual inductance M at outside of resistance body 11).

Figure 4:
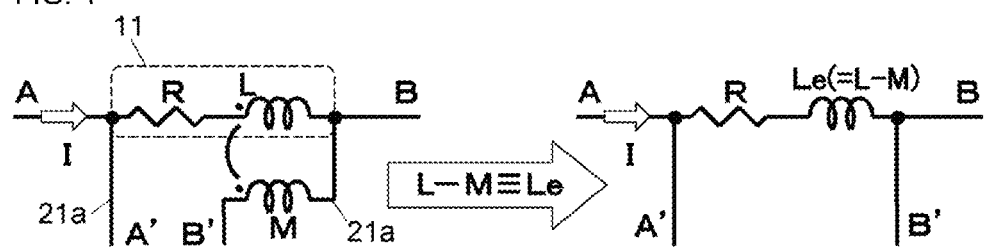
FIG. 4 is an equivalent circuit diagram of the resistor and the pair of wiring in the connector.

Accordingly, as shown in FIG. 4, besides detected voltage basing on resistance value R by current I flowing through the resistance body, error voltage basing on self-inductance L of resistance body and a voltage basing on mutual-inductance M at the pair of wiring 23 is caused. Here, since voltage caused by self-inductance L and voltage caused by mutual-inductance M are formed in opposite direction by same current, the inductance of resistance body 11 and wiring 23 seen from output end A',B' of connector 21 becomes L−M, and the inductance is defined as "effective inductance Le". Therefore, Le=L−M.

Figure 3C:
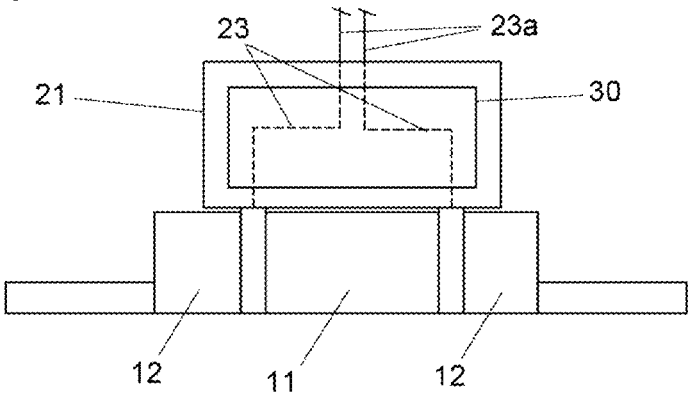
FIG. 3C is a construction view, which shows an example of transforming the device of FIGS. 3A and 3B.

FIG. 3C shows an example that metal layer 30 such as copper foil is formed in parallel with pair of wiring 23 where magnetic flux φ pass through. For example, metal layer 30 is formed on front side or back side of connector 21. Also it may be formed on back side of printed board, when wiring 23 is formed on front side of the printed board. By forming metal layer 30 where magnetic flux pass through, inductance Le can be reduced by eddy current. Also, when 3-phase inverter has a shunt resistor at each phase so as to measure each current at each phase independently, it can reduce influence of magnetic flux caused by adjacent phase current.

Figure 5:
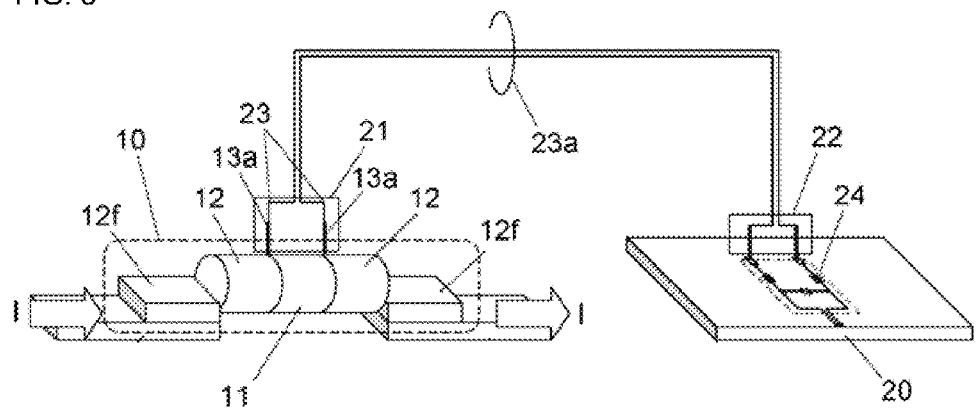
FIG. 5 is a view, which shows an embodiment of connection status of the shunt resistor device and the voltage detection circuit board.

The invention is to provide a voltage detection circuit, which can remove influences of the error voltages caused by the self-inductance L existing in the resistor, besides normal voltage detection basing on the resistance value R of the resistance body 11. Therefore, as shown in FIG. 5, a connector 22 is installed at ends of parallel wires or twisted wires 23*a*, and which is coupled through the connector 22 to a low-pass filter 24 on a voltage detection circuit board 20. It is necessary to fix the effective inductance Le to a constant value, and to match it to circuit constants of the low-pass filter 24 for removing influences of error voltages.

For fixing effective inductance Le to a constant value, voltage detection wiring including detection terminals 13*a*, which are pulled out from both ends of resistance body 11, and wiring 23, have to be disposed so as to form a loop for securing a constant area at any time in a plane including center of current that flows in the resistance body. When fixing effective inductance Le to a constant value, there is no necessity that distance between a pair of wiring 23 is the same with distance between a pair of detection terminal 13*a*. However, by taking the area as large as possible within a range where influence of external magnetic flux is not affected, change to error margin of size decreases. Thus, it is preferable that distance between a pair of wiring 23 is equal to distance between a pair of detection terminal 13*a*.

And, as an example of height of the pair of wiring 23, that is, a distance X from resistance body to bent section of wiring, assuming Y to be diameter of resistance body, can be set as $0 \leq X \leq Y$. When $X \gg Y$, there is a possibility of causing error voltage by external magnetic flux passing through the area S, besides by current flowing through resistance body. However, it is desirable to take area S where magnetic flux pass through large, within a range where influence by external magnetic flux is not affected, for reducing influence by change of self-inductance L. For instance, when diameter of resistance body becomes small (for instance, 4 mm or less in the diameter), even if $X > Y$, since area S becomes not excessively large, influence of external magnetic flux doesn't become affected too much. Moreover, when detection of direct current for instance, that is, in case of current detection under condition that influence of skin effect described later is not affected, distance X may be dose to 0 as possible for reducing influence of external magnetic flux.

Figure 6:
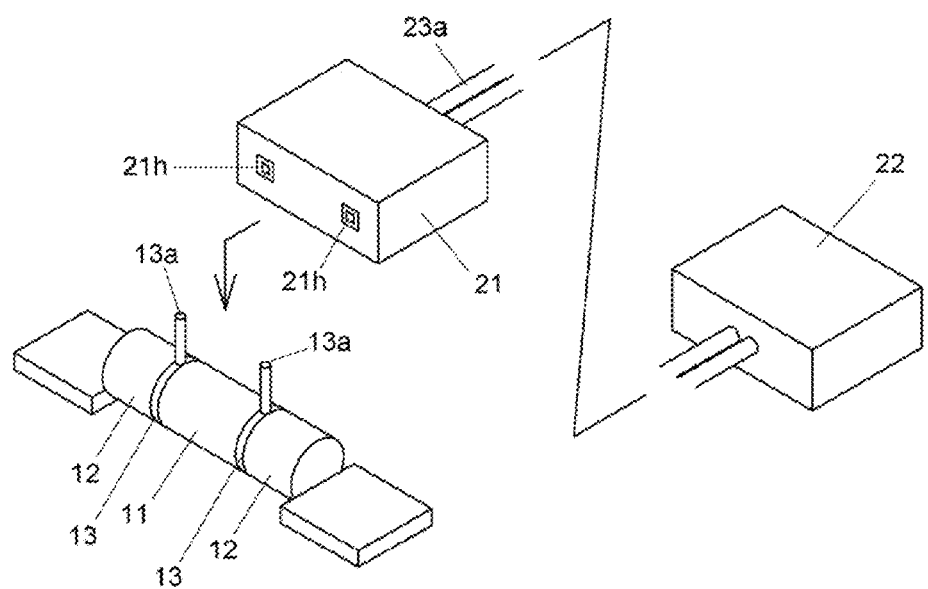
FIG. 6 is a view, which shows an example of shapes of first and second connectors.

FIG. 6 shows example of shapes of connectors 21, 22. Since detection terminal 13*a* of the resistor extends and is projected upward from terminal material (detection electrode 13) that abuts to both end faces of resistance body 11, it is possible to install connector 21 easily by inserting its hole 21*h* into detection terminal 13*a*.

Figure 7:
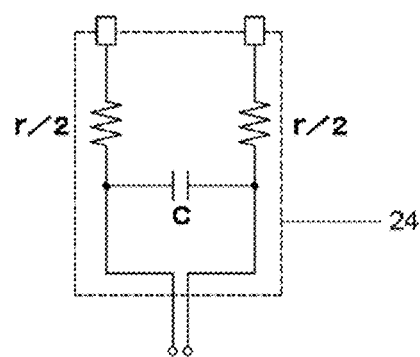
FIG. 7 is an equivalent circuit diagram of low-pass filter, which consists of resistance r and capacitance C.

FIG. 7 shows an example of low-pass filter circuit, which consists of resistance r and capacitance C, formed on voltage detection circuit board 20. The low-pass filter 24 is connected to following stage of the pair of wiring 23 in the connector 21. Assuming effective inductance Le(=L−M), resistance value R of resistance body 11, capacitance C and resistance r of low-pass filter, the low-pass filter has the relationship;

$$Le/R = C \cdot r.$$

Figure 8:
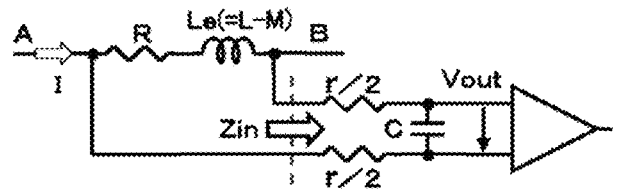
FIG. 8 is an explanatory view of error voltage removal by the low-pass filter.

When above relationship is obtained, error voltage caused by current I flowing through self inductance L of resistance body 11, is cancelled by voltage caused by mutual inductance M at the pair of wiring 23 and low-pass filter 24 by reasons shown in FIG. 8. Then the error voltage does not appear to the output voltage. As a result, only voltage by product of resistance R of resistance body 11 and current I is taken out to output voltage.

Accordingly, big error voltage, which is caused by self-inductance L of resistance body of current detection resistor at vicinity of wave peak and wave bottom especially when serration wave current flows to the resistor, is removed. Therefore, it becomes possible to take out only voltage by resistance value R proportional to normal current I.

Figure 9:
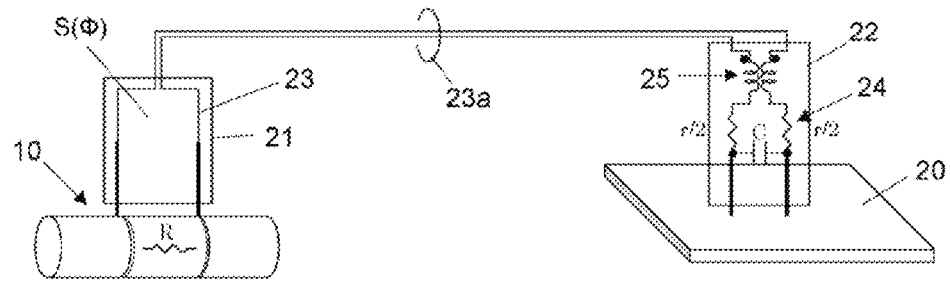
FIG. 9 is a view, which shows another embodiment of connection status of the shunt resistor device and the voltage detection circuit board.

Further, low-pass filter 24 that consists of capacitance C and resistance r is not necessary to be disposed in voltage detection circuit board 20. It can be disposed at anywhere, if it is disposed at following stage of the pair of wiring 23, which causes mutual-inductance M. As shown in FIG. 9, it may be disposed on voltage detection circuit board inside of connector 22. In the embodiment, common mode chalk coil 25 is further disposed in connector 22 so as to remove in-phase signal.

As a result, these elements are not necessary to be disposed in the voltage detection circuit board 20, where signal processing circuit such as microcomputers has been disposed. And, by using parallel wires or twisted wires 23*a* that connects connectors 21 and 22, it is not necessary to adjust filter constants on board 20 that signal processing circuit such as microcomputers is disposed. Effect of the filter rises more than the filter disposed in the connector 21. As to outer turbulences, since low-pass filter 24 is disposed just before voltage detection circuit board 20, then stability rises. Further, a common mode choke coil 25 may be coupled with the low-pass filter 24.

Figure 10:
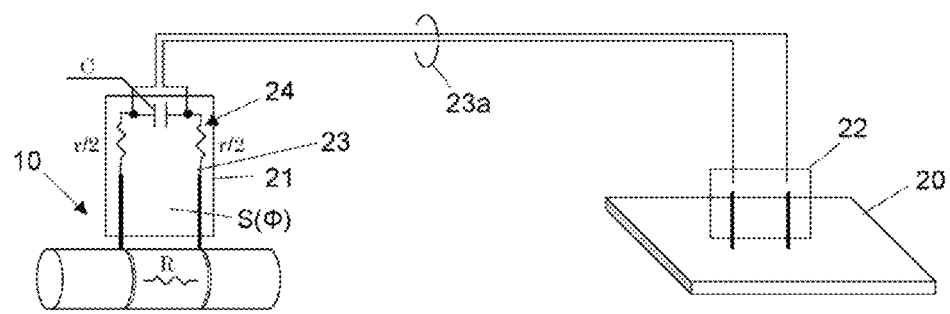
FIG. 10 is a view, which shows another embodiment of connection status of the shunt resistor device and the voltage detection circuit board.

In addition, as shown in FIG. 10, by serially connecting a pair of resistor (r/2) to the pair of wiring 23, and connecting a capacitor (C) between the pair of wiring 23, low-pass filter 24 may be disposed at the pair of wiring 23 itself. As a result, mutual-inductance M is formed at the pair of wiring 23, caused voltage pass through low-pass filter 24, and error voltage caused by self-inductance L of resistance body 11 is removed. Then, only the voltage by product of resistance R of resistance body 11 and current I is sent to voltage detection circuit board 20 by parallel wire or twisted wire 23*a*. Further, common mode chalk coil may be disposed anywhere, however, when disposing the chalk coil in connector 22 side, it is thought that effect of common mode noise removal is high.

Figure 11:
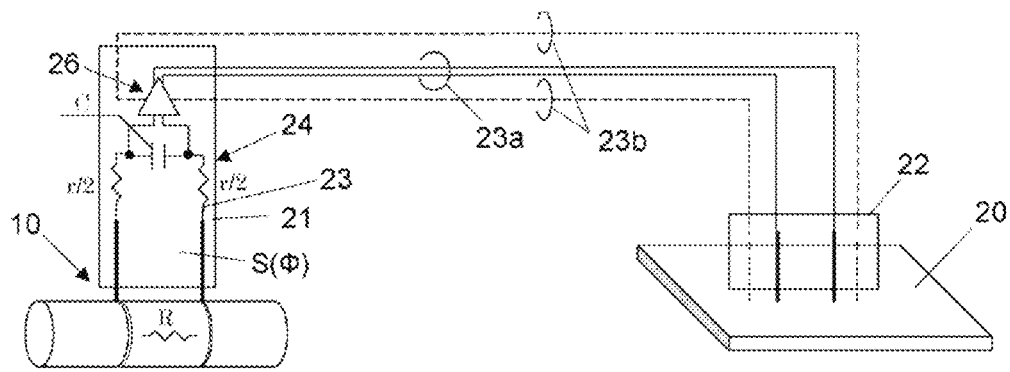
FIG. 11 is a view, which shows another embodiment of connection status of the shunt resistor device and the voltage detection circuit board.

FIG. 11 shows an example, where amplifier 26 is further installed in connector 21 so as to raise signal level and to improve S/N ratio. Also, common mode chalk coil 25 may be installed in connector 22. In the example, besides signal line 23*a* consisting of parallel wire or twisted wire, though power supply line 23*b* to operate the amplifier is needed, there is a feature that S/N ratio of signal can be kept high even though current detection resistor 10 and voltage detection circuit board 20 are away, because signal level is high by amplifier 26.

Figure 12:
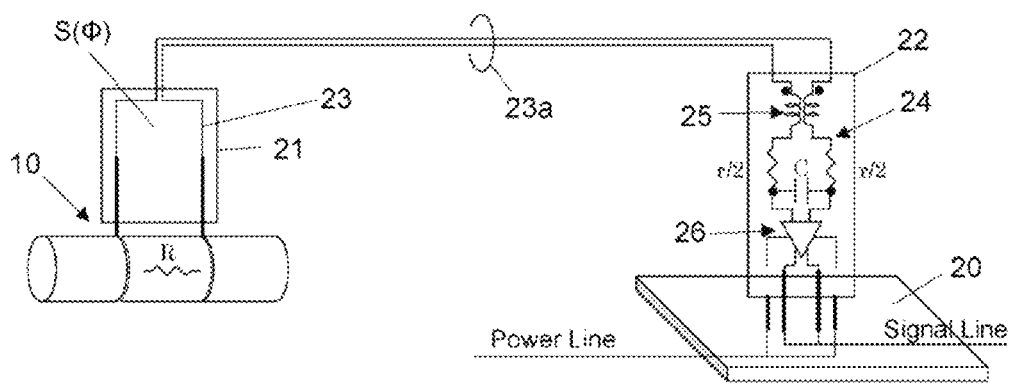
FIG. 12 is a view, which shows another embodiment of connection status of the shunt resistor device and the voltage detection circuit board.

FIG. 12 shows an example, where connector 21 side accommodates only pair of wiring 23 for forming mutual-inductance M, and connector 22 side accommodates common mode chalk coil 25, low-pass filter 24, and amplifier 26. As a result, there is an advantage that composition of voltage detection circuit board 20 can be simplified.

Figure 13:
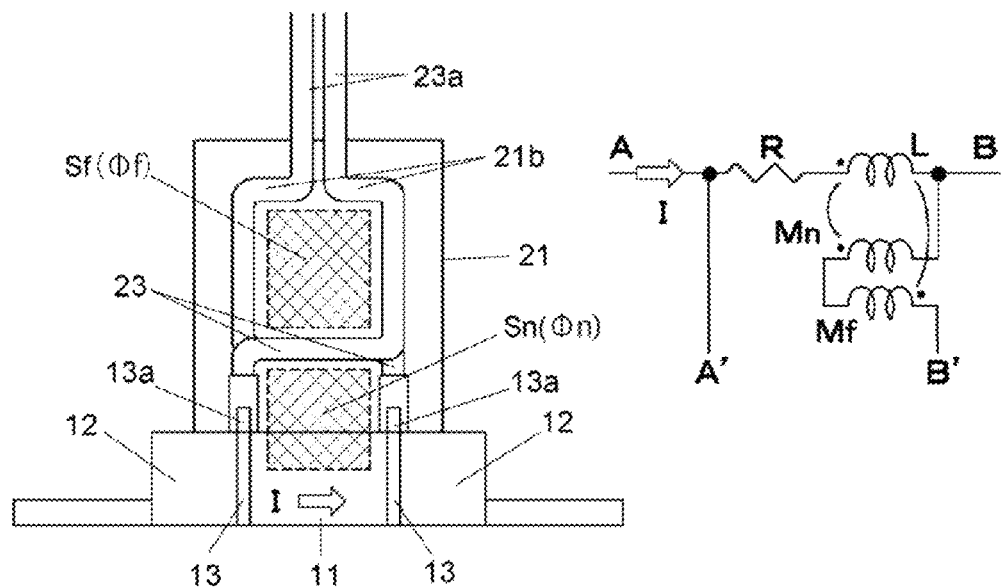
FIG. 13 is views, where left view is a cross-sectional view of the connecter that has a pair of wiring being doubly looped, and left view is its equivalent circuit diagram.

Left view of FIG. 13 shows an example of a wiring pattern in which effective inductance Le can be adjusted to 0. Inside of the connector 21, a first pair of wirings 23 is provided for fitting and electrically connecting to detection terminals 13*a* respectively. The pair of wirings 23 has a first loop extending upward keeping a distance between a pair of detection terminals 13*a*, 13*a*, extending horizontally at a predetermined height, and intersecting, and a second pair of wirings 21*b*, which forms a second loop extending horizontally up to same distance above, in addition extending upward, extending horizontally at a predetermined height, and becoming adjacent or intersecting. Second pair of wirings, which becomes adjacent or intersected, are connected to the voltage detection circuit board 20 by parallel wires or twisted wires 23a through the connector 22 similarly to the above-mentioned embodiments.

Magnetic flux ϕn, which is caused by current I flowing through resistance body 11, pass through surface Sn formed by first loop. And, voltage is caused by mutual-inductance Mn, as shown in right view of FIG. 13. Similarly, magnetic flux ϕf, which is caused by current I flowing through resistance body 11, pass through surface Sf formed by second loop, and voltage is caused by mutual-inductance Mf.

Accordingly effective inductance Le becomes, $$Le=L-Mn-Mf.$$

When L=Mn+Mf, then Le=0. That is, error voltage caused by self-inductance L of resistance body can be cancelled by voltage caused by mutual-inductances Mn+Mf. Therefore, in this case, installation of low-pass filter is not necessary.

Magnetic flux ϕf is caused by current I flowing through resistance body 11 and pass through loop surface Sf of away side. And, magnetic flux ϕn pass through loop surface Sn that is close to resistance body than loop surface Sf. Then, magnetic flux density Bf, Bn becomes, $$Bn>Bf.$$

Accordingly, for obtaining following relation, $$\int_{Sf} Bs \cdot ds = \int_{Sn} Bn \cdot ds$$

it is necessary to be $$(\text{Area } Sf) > (\text{Area } Sn).$$

Figure 14:
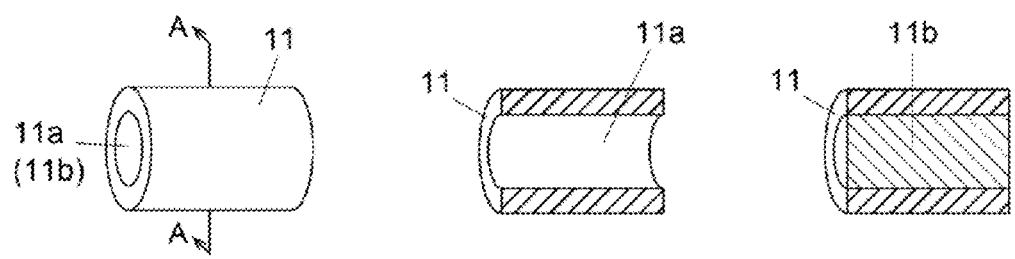
FIG. 14 is views, where left view is a perspective view, center view and right view are cross-sectional views in direction of AA arrow in the left view, and each view shows an example of a resistance body that has a hollow or a high resistance part inside thereof.

FIG. 14 shows an embodiment that dispose a penetration hole 11a or a high resistance material 11b inside of resistance body 11. Usually, as to resistance body 11, columnar-shaped or plate-shaped resistance alloy material of low resistivity and excellent TCR is used. In the embodiment, a penetration hole ha or a high resistance material 11b is disposed inside of columnar-shaped resistance body consisting of above-mentioned material. Though resistance body has an effect even if section is rectangle-shaped (square pillar resistance body), resistance body of circle-shaped in section is shown as more desirable shape in the embodiment of the invention. Here, inside of resistance body 11 is hollow or high resistance part.

There is a tendency that frequency of current to be monitored becomes higher by necessity for improvement of control accuracy etc. Especially, when serration wave current flows to current detection resistor, for instance, the current includes a large amount of high frequency components. The current of high frequency components flows to be biased to outer portion of the resistance body by skin effect, and the current becomes difficult to flow at center portion. Accordingly, resistance value rises because effective area where high-frequency current flows decreases. Therefore, an accurate current detection becomes difficult upon the current including high frequency components.

Then, as shown in FIG. 14, by forming a penetration hole ha or a high resistance portion 11b going through in direction of axis inside of columnar-shaped resistance body 11, since current doesn't flow originally in the penetration hole or the high resistance portion, fluctuation band in the current pathway can be reduced. Accordingly, change of resistance value by skin effect of current by high frequency components can be controlled, and current detection with higher accuracy can be possible. However, skin effect depends on diameter of the resistance body, so, there are cases where penetration hole 11a or high resistance portion 11b might not be necessary.

Figure 15:
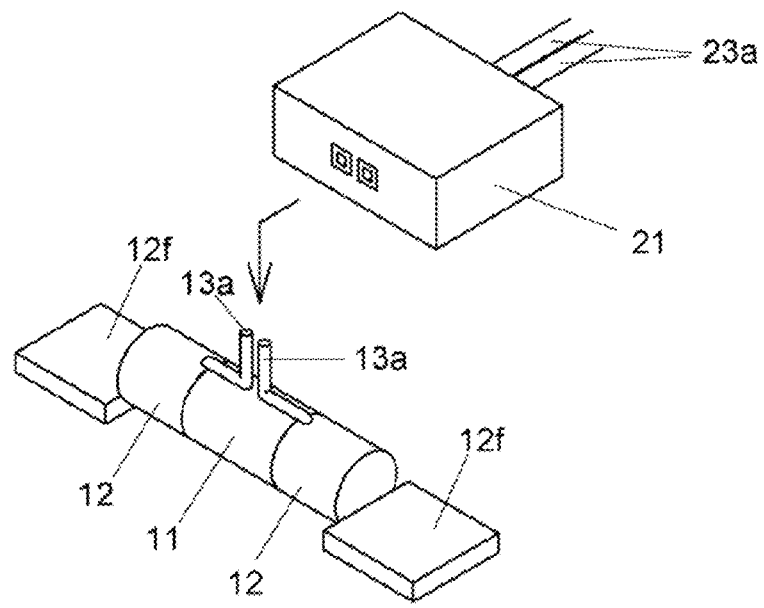
FIG. 15 is a perspective view according to another embodiment of the shunt resistor device.
Figure 16:
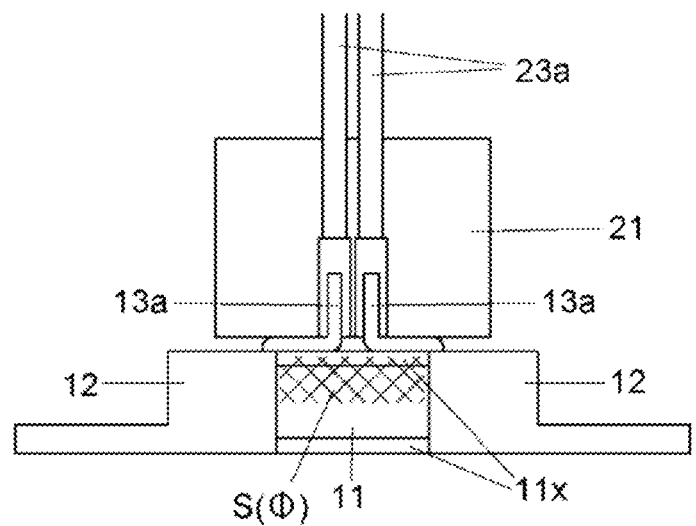
FIG. 16 is a view, which shows an example of connecting the resistor and the connector in the device shown in FIG. 15.

FIG. 15 and FIG. 16 shows an example of shunt resistor device that a pair of voltage detection terminal 13a is extended from near both ends of resistance body 11 crawling on a surface of insulative resin 11x, which covers resistance body 11, and the pair of voltage detection terminal 13a becomes adjacent at central portion, and is projected upward. Resistance body 11 is thinner than main electrode 12. An end of detection terminal 13a is fixed at connecting portion on outer surface of main electrode 12, and another end is connected to wiring (twist wire 23a). Further, an end of detection terminal 13a may be connected to end face of main electrode 12 of resistance body 11 sides. The voltage detection wiring consisting of detection terminal 13a and wiring 23a becomes adjacent at prescribed portion, that is, at detection terminal 13a. Insulation is kept by disposing insulative resin 11x etc. with voltage detection terminal 13a and resistance body 11. The projected portion of voltage detection terminal 13a is connected to twist wire 23a not shown. In the example, since a part of voltage detection terminal 13a is extended and fixed along current direction, effective inductance Le can be fixed to a constant value.

Although embodiments of the invention has been explained, however the invention is not limited to above embodiments, and various changes and modifications may be made within scope of the technical concept of the invention.

INDUSTRIAL APPLICABILITY

The invention can be applicable for a voltage detection circuit, which detects voltage caused by current to be monitored flowing through a shunt resistor at both ends of the resistance body.

The invention claimed is:

1. A shunt resistor device comprising:
   a resistance body;
   a pair of main electrodes for flowing current to be monitored through the resistance body;
   a pair of detection terminals for detecting voltage across the resistance body, each detection terminal connected to one of main electrodes;
   a pair of wirings each electrically connected to one of detection terminals; and
   a pair of connection portions on the pair of main electrodes, wherein each of the detection terminals is directed outward from one of the connection portions, while keeping a predetermined distance between the pair of detection terminals to be constant, the wirings are bent at a predetermined location from the pair of main electrodes such that a distance between the wirings is smaller at the predetermined location than the predetermined distance between the pair of detection terminals.

2. The shunt resistor device according to claim 1, wherein the pair of detection terminals are connected to the pair of wirings by a connector, and the predetermined location is provided in the connector.

3. The shunt resistor device according to claim 1, wherein a low-pass filter consisting of a resistance (r) and a capacitance (C) is coupled with the pair of wirings, and the low-pass filter has the relationship, $$Le/R=C \cdot r$$

assuming an effective inductance (Le) (=a self-inductance (L) of the resistance body−a mutual-inductance (M) of the pair of wirings), and a resistance value (R) of the resistance body.

4. The shunt resistor device according to claim 1, wherein a section of the resistance body is circle-shaped.

5. The shunt resistor device according to claim 1, wherein the resistance body is provided with a hole or a high resistance portion inside thereof.

6. The shunt resistor device according to claim 1, wherein each detection terminal is connected to a portion of one of the main electrodes adjacent to the resistance body.

* * * * *